United States Patent [19]
Mattfeld et al.

[11] 3,988,695
[45] Oct. 26, 1976

[54] PROTECTION CIRCUIT FOR OUTPUT STAGE OF LOW FREQUENCY AMPLIFIERS

[75] Inventors: Johann Mattfeld, Heilbronn; Alfons Schmitt, Talheim, both of Germany

[73] Assignee: Licentia Patent-Verwaltungs-G.m.b.H., Frankfurt am Main, Germany

[22] Filed: Mar. 17, 1975

[21] Appl. No.: 559,020

[30] Foreign Application Priority Data
Mar. 30, 1974  Germany.......................... 2415628

[52] U.S. Cl. .......................... 330/207 P; 307/202 R
[51] Int. Cl.² ........................................ H03F 21/00
[58] Field of Search ............ 330/207 P; 307/202 R; 317/33 C, 33 SC

[56] References Cited
FOREIGN PATENTS OR APPLICATIONS

| | | | |
|---|---|---|---|
| 286,360 | 12/1970 | Austria ............................ | 330/207 P |
| 1,941,694 | 2/1971 | Germany ......................... | 330/207 P |
| 2,059,739 | 6/1972 | Germany ......................... | 330/207 P |
| 4,617,801 | 5/1971 | Japan .............................. | 330/207 P |

Primary Examiner—James B. Mullins
Attorney, Agent, or Firm—Spencer & Kaye

[57] ABSTRACT

An electronic cut out for the protection of output stage transistors of a low frequency amplifier comprises means for producing first and second direct voltages proportional to the output alternating voltage and the collector alternating current of the output stage transistors respectively, means for comparing these voltages and igniting a thyristor if the second voltage exceeds a predetermined threshold, the thyristor being connected to short circuit the low frequency signal to earth prior to its arrival at the output stage transistors when the thyristor is ignited.

2 Claims, 2 Drawing Figures

3,988,695

PROTECTION CIRCUIT FOR OUTPUT STAGE OF LOW FREQUENCY AMPLIFIERS

BACKGROUND OF THE INVENTION

This invention relates to an electronic cut-out for the protection of the output stage transistors of a low frequency amplifier.

Normal fine fuses are practically unusable, on account of their inertia for the protection of power transistors in low frequency output stages so that electronic protective circuits which react substantially more quickly, have to be used.

Inter alia current limiting circuits are known in which on achieving a specified maximum current in the output stage transistors, a transistor controlled by this current becomes conductive and in turn limits the control signal of the output stage transistors to be protected, so that the collector current cannot rise further. The disadvantage of this current limiting circuit is the high power loss occurring in the limiting case, in the output stage transistor, from which considerable thermal problems result.

In the case of other known circuits, the operating point of the circuit is changed. By a change of the direct current quiescent operating point however, disturbances can occur in the circuit, by which the output stage transistors are destroyed in spite of the cut-out present.

SUMMARY OF THE INVENTION

According to a first aspect of the invention, there is provided an electronic cut-out for the protection of output stage transistors of a low frequency amplifier comprising means for producing a first direct voltage proportional to the amplifier output alternating voltage, means for producing a second direct voltage proportional to the collector alternating current of the output stage transistors, and of opposite polarity to said first direct voltage, a capacitor at which said first and second direct voltages are compared, a thyristor ignitable by said capacitor on an increase of said second direct voltage beyond a predetermined threshold and means for connecting said thyristor prior to said output stage transistors to short circuit the signal being amplified to be fed to said output stage transistors to earth.

According to a second aspect of the invention, there is provided an electronic cut-out for the protection of output stage transistors of a low frequency amplifier in which a direct voltage obtained from the output alternating voltage and proportional thereto is compared at a capacitance with a direct voltage, proportional to the collector alternating current in the output stage transistors, which direct voltage is of opposite polarity, characterized in that said capacitance is connected to a control electrode of a thyristor, which, with an increase of said direct voltage proportional to the collector current in the output stage transistors over a permissible threshold is switched through and in that the thyristor is so connected to an input line of the output stage, which line conducts the low frequency signal, that the low frequency signal is passed to earth through said thyristor when said thyristor is switched through.

BRIEF DESCRIPTION OF THE DRAWING

The invention will now be described in greater detail by way of example with reference to the drawings wherein.

DESCRIPTION OF THE PREFERRED EMBODIMENT

Figure 1:
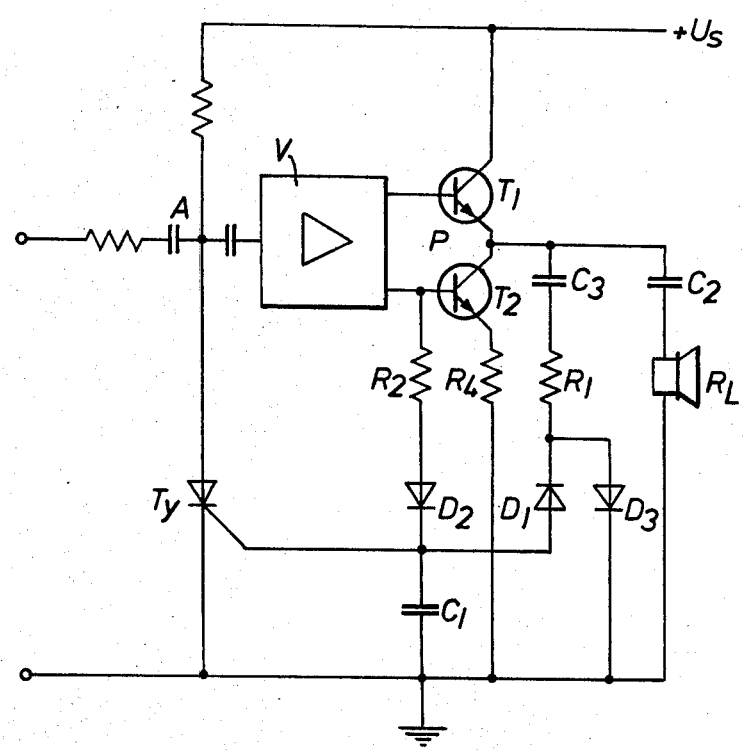
FIG 1 is a circuit diagram of one form of the invention.

The present invention starts from an electronic cut-out for the protection of output stage transistors of a low frequency amplifier in which a direct voltage obtained from the output alternating voltage and proportional thereto is compared at a capacitance with a direct voltage of opposite polarity, which direct voltage is proportional to the collector alternating current in the output stage transistors. It is to be ensured that even in the case of effective cut-out, the direct current quiescent bias point remains retained.

In the case of a circuit of the type named, therefore, it is basically proposed, in accordance with the invention, that the capacitance is connected to the control electrode of a thyristor which with the increase of the direct voltage proportional to the collector current in the output stage transistors, is switched through above an admissible threshold value, and in that the thyristor is so connected to an input line of the amplifier conducting the low frequency signal that the low frequency signal is derived, in the case of a driven thyristor, via the thyristor.

In the case of the circuit in accordance with the invention, thus, the low frequency output voltage and the collector current, which corresponds to the low frequency output current, is measured. The two direct voltage values resulting therefrom and of opposite polarity are added. The resulting sum is a measure of the ballast resistance. If this ballast resistance becomes too small, for example through a short circuit, the output alternating voltage decreases and the collector current increases through the output stage transistors. In this way the voltage at the capacitance connected to the thyristor is varied in such a manner that this thyristor is switched through and the low frequency input signal is short circuited.

Referring now to the drawings, only the two output stage transistors $T_1$ and $T_2$, connected in series, are shown, in front of which is connected the pre-amplifier V in a known manner. Half the direct voltage supply is applied to the connection P between the two transistors. A ballast resistance $R_L$ is connected via the capacitance $C_2$ to the output P. In order to measure the output alternating voltage, there is connected, at the point P, a series circuit of an isolating capacitance $C_3$, a resistance $R_1$ and a diode $D_1$. This series circuit is connected to a capacitance $C_1$ which is connected between the earth or ground electrode and the control electrode of the thyristor Ty. The diode $D_1$ is so poled that only the negative half wave causes a current flow via the resistance $R_1$. The rectified negative voltage thus resulting at the resistance $R_1$ charges the capacitance to a negative potential. The diode $D_3$ between the earth or ground electrode and the junction $D_1$, $R_1$ closes the direct current circuit.

Further, the current is to be measured through the collector of the output stage transistors. For this there is connected, to the base electrode of the transistor $T_2$, a series circuit of a resistance $R_2$ and the diode $D_2$, which again is connected to the capacitance $C_1$. This is possible since the potential at the base electrode of the transistor $T_2$ is greater by the negligibly small base-emitter voltage than the voltage at the emitter resistance $R_4$ of the transistor $T_2$. The diode $D_2$ is so connected that a current can flow through it only during the positive half-wave of the low frequency signal. Thus a positive rectified voltage, which charges the capacitance up $C_1$ to a positive potential, drops at the resistance $R_2$.

It is thus obvious that the two direct voltages which are proportional to the collector current or the output alternating voltage, corresponding to the dimensioning of the resistance $R_1$ and $R_2$, subtract from each other at the capacitance $C_1$. The resistances $R_1$ and $R_2$ are so dimensioned that, in the case of the normal ballast resistance $R_L$, the residual voltage at the capacitance $C_1$ is not sufficient to ignite or fire the thyristor. However, should the resistance $R_L$ be substantially smaller or even short circuited, then the output alternating voltage decreases and the collector current through the output stage transistors increases. Thus the positive sum voltage at the capacitance $C_1$ increases to a value at which a thyristor $Ty$ is switched through.

Figure 2:
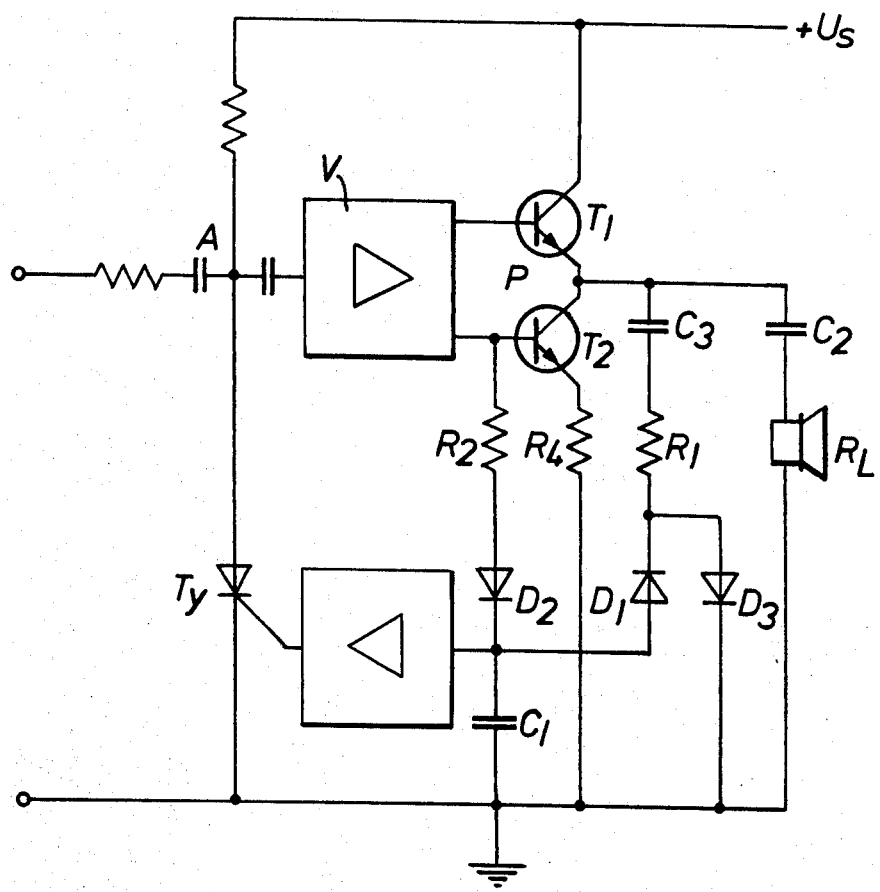
FIG. 2 is a circuit diagram showing a modification of the embodiment of FIG. 1.

The thyristor $Ty$ is so connected that the low frequency signal is short circuited in an amplifier stage preceding the output stage. Thus the thyristor is connected directly (FIG. 1) or via an additional transistor arrangement to the input A of the pre-amplifier. With a switched-through thyristor the low frequency input signal is led away to earth via the thyristor. The arrangement is reset into the normal state with a non-conducting thyristor only by switching off and then switching on the operating voltage. In an advantageous manner, as shown in FIG. 2, an additional transistor amplifier can be connected to the control electrode of the thyristor between the capacitance $C_1$ and the control electrode of the thyristor.

It will be understood that the above description of the present invention is susceptible to various modification changes and adaptations.

What is claimed is:

1. An electronic cut-out for the protection of the output transistors of the output stage of a low frequency amplifier comprising, in combination: first means for producing a first direct voltage proportional to the alternating output voltage of the amplifier, said first means including a first resistor connected to the output of the amplifier and a first diode connected in series with said first resistor; second means for producing a second direct voltage proportional to the collector alternating current of the output stage transistors and of opposite polarity to said first direct voltage, said second means including a second resistor connected to the base of one of said output stage transistors and a second diode connected in series with said second resistor; means for comparing said first and second direct voltages including a capacitor having one terminal connected to each of said first and second diodes and its other terminal connected to ground; and means responsive to the voltage on said capacitor for shunting the low frequency input signal to said output stage of said amplifier to ground when said second direct voltage increases beyond a permissible threshold value, said means for shunting including a normally non-conducting thyristor connected between a signal input line to said output stage and ground, and having its control electrode connected to said one terminal of said capacitor whereby said thyristor shunts the low frequency input signal to ground when it is ignited by the voltage on said capacitor.

2. An electronic cut-out according to claim 1 further comprising a transistor amplifier connected between said one terminal of said capacitor and said control electrode of said thyristor.

* * * * *